(12) United States Patent
Fang et al.

(10) Patent No.: US 12,386,147 B2
(45) Date of Patent: Aug. 12, 2025

(54) COOLING SUB-ASSEMBLY

(71) Applicant: BARCO N.V., Kortrijk (BE)

(72) Inventors: Zhi Qiang Fang, Kortrijk (BE);
Alexander Von Poncet, Kortrijk (BE);
Bart Malfait, Kortrijk (BE); Wouter Maurice S Janssens, Kortrijk (BE)

(73) Assignee: BARCO N.V., Kortrijk (BE)

( * ) Notice: Subject to any disclaimer, the term of this patent is extended or adjusted under 35 U.S.C. 154(b) by 0 days.

(21) Appl. No.: 17/795,912

(22) PCT Filed: Jan. 30, 2020

(86) PCT No.: PCT/CN2020/074080
§ 371 (c)(1),
(2) Date: Jul. 28, 2022

(87) PCT Pub. No.: WO2021/151233
PCT Pub. Date: Aug. 5, 2021

(65) Prior Publication Data
US 2023/0089340 A1 Mar. 23, 2023

(51) Int. Cl.
*G02B 7/18* (2021.01)
*F28D 15/02* (2006.01)
(Continued)

(52) U.S. Cl.
CPC ....... *G02B 7/1815* (2013.01); *F28D 15/0275* (2013.01); *G02B 26/0833* (2013.01); *H10N 10/13* (2023.02); *F28D 2021/0029* (2013.01)

(58) Field of Classification Search
CPC .............. G02B 7/1815; G02B 26/0833; F28D 15/0275; F28D 2021/0029; H10N 10/13;
(Continued)

(56) References Cited

U.S. PATENT DOCUMENTS 6,082,443 A * 7/2000 Yamamoto ............ F28D 15/046
174/15.2
9,733,680 B1 8/2017 Voth et al.
(Continued)

FOREIGN PATENT DOCUMENTS

| CN | 2786786 Y | 6/2006 |
| CN | 101685330 A | 3/2010 |

(Continued)

OTHER PUBLICATIONS

Office Action issued in Taiwanese Application No. 110112797, dated Aug. 16, 2024, with machine translation.
(Continued)

*Primary Examiner* — Michael Y Sun
(74) *Attorney, Agent, or Firm* — HSML P. C.

(57) ABSTRACT

A cooling sub-assembly for cooling a heat dissipating electronic device. The sub-assembly may include a vapor chamber, a peltier element and a coldplate placed on top of each other forming a stack such that the peltier element is sandwiched between the vapor chamber and the coldplate. The vapor chamber has a head facing the peltier element, a foot for facing the heat dissipating electronic device, and a wall extending between the foot and the head. The area of the head is larger than the area of the foot.

13 Claims, 4 Drawing Sheets

(51) Int. Cl.
*G02B 26/08* (2006.01)
*H10N 10/13* (2023.01)
*F28D 21/00* (2006.01)

(58) Field of Classification Search
CPC ....... G03B 21/008; G03B 21/16; H01L 23/38; H01L 23/427; H01L 23/473
See application file for complete search history.

(56) References Cited

U.S. PATENT DOCUMENTS

| | | |
|---|---|---|
| 10,739,830 B2 | 8/2020 | Lee et al. |
| 2001/0020365 A1 | 9/2001 | Kubo et al. |
| 2002/0080583 A1 | 6/2002 | Prasher et al. |
| 2004/0187501 A1 | 9/2004 | Sauciuc et al. |
| 2006/0000500 A1* | 1/2006 | Sauciuc .................. H01L 23/38 136/212 |
| 2007/0034355 A1 | 2/2007 | Kuo |
| 2008/0053640 A1 | 3/2008 | Mok |
| 2012/0047911 A1* | 3/2012 | Bhavsar .................. F25D 11/00 62/3.6 |
| 2014/0246176 A1 | 9/2014 | Yang |
| 2021/0043544 A1* | 2/2021 | Eid .................... H03H 9/02102 |

FOREIGN PATENT DOCUMENTS

| | | |
|---|---|---|
| CN | 101770179 A | 7/2010 |
| CN | 104007796 A | 8/2014 |
| CN | 108093604 | 5/2018 |
| CN | 108780343 | 11/2018 |
| CN | 110430736 | 11/2019 |
| DE | 102010020932 A1 | 11/2011 |
| DE | 102015111427 A1 | 1/2017 |
| FR | 3082051 | 12/2019 |
| TW | 200708232 | 2/2007 |

OTHER PUBLICATIONS

Office Action issued in Chinese Application No. 202080095328.X, dated Aug. 28, 2024, with machine translation.
Office Action issued in Chinese Application No. 202080095328.X, dated Jan. 18, 2025, with English translation.
Office Action issued in Chinese Application No. 202080095328.X, mailed Mar. 26, 2025, with English translation.
Office Action issued in Taiwanese Application No. 110112797, dated Feb. 25, 2025, with English translation.

* cited by examiner

COOLING SUB-ASSEMBLY

TECHNICAL FIELD

The present disclosure relates to a cooling sub-assembly for cooling a heat dissipating electronic device.

BACKGROUND

Inside digital projectors, light is cast onto and reflected by a pixel light modulator within an optical engine, such as a DMD (Digital Micro Mirror Device), LCOS, LCD or the like (All referred to as "DMD" henceforth in this document). Some of this light is lost & absorbed within the DMD itself, causing unwanted heating-up. The lifetime of the modulation capacity of the DMD is dependent on the temperatures and temperature gradients within the DMD. In order to maintain the lifetime of the DMD, the DMD sub-components must be contained below certain specified temperatures and temperature gradients.

For the purpose of sufficiently cooling the DMD, sub ambient/below ambient cooling of the back of the DMD is often required. Some present systems rely on chilled liquid to cool the system/DMD's. Some systems also apply air drying technologies as well as air-tight compartments as well as vapor-tight compartments to avoid humidity ingress and to avoid condensation on theses sub-ambient components and sub-systems.

The technical complexity and scale of application of those conventional solutions using chilled liquid imply several weaknesses.

Firstly, all components & sub-systems within the cooling chain are at a temperature below the ambient temperature. This may cause possible unwanted condensation build-up at any location in the cooling chain. To avoid condensation, careful insulating and/or, sealing and airdrying techniques are applied. Insulation of a complete cooling system is bulky and prone to weaknesses. Combatting condensation using active air-treatment is highly complex & costly, and not the most ecological answer. It requires a vapor-tight environment in combination with almost continuously-running active air dryers to prevent water droplets from forming internally. Result in turn may be that the system continuously expels water droplets.

Secondly, to deliver the chilled liquid and at times serve to feed this chilled liquid into active air-dryer systems, chillers are applied. These are bulky due to their high power which is needed to keep the entire cooling circuit and auxiliary equipment cold. The size, weight and vibrations of a chiller often make them impossible to install inside a projector. Hence, these are usually set-up externally next to the projector, with liquid tubing running to and from the projector. The technical complexity of such a set-up makes it prone to errors and regular servicing by skilled/certified personnel is required.

Hence the need for improvement in the art.

SUMMARY

In order to overcome the problems of the prior art, a cooling sub-assembly for cooling a heat dissipating electronic device is provided. The cooling sub-assembly is comprised of a vapor chamber and a cooling unit placed on top of each other forming a stack, whereby the vapor chamber has a head facing the cooling unit, a foot for facing the heat dissipating electronic device, and a wall extending between the foot and the head, and wherein the area of the head is larger than the area of the foot.

By applying a stacked structure including a vapor chamber and a cooling unit, wherein a foot of the vapor chamber facing the heat dissipating electronic device has a smaller area than a head of the vapor chamber, a cooling unit may have a larger surface area than the back-surface of the electronic device to be cooled, thereby enabling effective and efficient cooling functionality for high power dissipation. Hereby, the vapor chamber serves as an interface device that transfers the heat away from a small-surface DMD towards a large-surface cooling unit. The vapor chamber serves as a heat spreader, in lateral directions, but also transports the heat in a direction perpendicular to and away from the backside of the electronic device.

The cooling unit may include a coldplate such as a liquid-cooled coldplate or an air-cooled heatsink, e.g. a forced convection air-cooled heatsink e.g. for cooling relatively small chips with relatively low power dissipation. Furthermore, the cooling unit may include a peltier element sandwiched between the vapor chamber and the coldplate.

The above approach overcomes difficulties by containing the problem close to the electronic device and by using smaller active components surrounded by only passive components.

The solution allows for local sub-ambient cooling of a DMD exposed to high levels of incident laser light using traditional local cooling Thermo electric cooler, Tec, or peltier technology. The cooling may be fully integrated within the projector, and is not dependent on orientation.

In principle, the cooling concept may not only be used for cooling DMD but also other heat dissipating devices, such as for laser cooling so as to lower the wavelength of red lasers by sub-ambient cooling which reduces the incident optical power on the DMD.

When applied to projectors equipped with one or more DMD's, the following advantages may be obtained:
  Cheaper projector (no cost of external chillers air dryers)
  Simpler projector set-up (less components, no external devices (chillers, tubing))
  Simpler projector interior (less active components)
  No condensation water dripping from projector
  Faster start-up (no need to condition air dryer)
  No need for sealing of subassemblies within the projector
  Less maintenance overall (less active components)
  No need for a qualified airco technician
  Better for the environment (no refrigerant)
  Faster and easier to set-up (standalone projector)
  More compact footprint
  More reliable (less (active) components)
  Lighter system (no chiller, no airdryers)
  Orientation independent (as opposed to Chiller set-up)
  Projector has better ecological score (A-label)
  Higher light output without using external devices Advantageously, the head of the vapor chamber may have a closed edge contour and the foot may have a closed edge contour, whereby the wall extends between the head edge contour and the foot edge contour, thus providing a simple vapor chamber geometry.

In a specific embodiment, the wall includes a first wall portion, a second wall portion and an intermediate flange portion, the flange portion extending between a flange outer contour and a flange inner contour, such that the first wall portion extends between the head edge contour and flange outer contour and that the second wall portion extends between the flange inner contour and the foot edge contour.

Preferably, the head is mainly parallel to the foot and/or the intermediate flange portion is mainly parallel to the head and/or the foot.

Advantageously, the area of the head is a factor larger than the area of the foot, wherein the factor is larger than 1, preferably ranging between circa 1 and circa 10, more preferably ranging between circa 1.5 and circa 5, thereby obtaining an efficient heat transfer to the peltier element.

A cold side of the peltier element may face towards the head of the vapor chamber, wherein a hot side of the peltier element is facing towards the coldplate so as to obtain an efficient cooling functionality.

The stack may include thermal interface material between the peltier element and the head of the vapor chamber and/or between the peltier element and the coldplate.

Typically, the coldplate includes a liquid chamber, a liquid input port and a liquid output port.

By surrounding parts of the cooling sub-assembly operatively having a lower temperature than ambient air by an insulation material, moisture collection on the cold parts may be prevented. The insulation is a physical barrier impenetrable to air that is at the outside at a higher temperature than the dew point.

Furthermore, a cooling assembly may be provided, comprising a single or a multiple number of cooling sub assemblies, further comprising a liquid to air radiator or a liquid to liquid heat exchanger connected to the coldplate of the single or multiple number of cooling sub assemblies, via the corresponding liquid input and output ports.

Also, an electronic system may be provided, comprising a heat dissipating electronic device and a cooling sub-assembly, wherein a heat dissipating backside of the electronic device contacts the foot of the vapor chamber.

The electronics may further comprise of a printed circuit board having mounted thereon the electronic device.

Optionally, the electronic system may further comprise of an interposer providing electrical contact between the printed circuit board and the heat dissipating electronic device.

Also, the electronic system may comprise of a heating element for heating the interposer, preferably further comprising a heat insulating layer covering a side of the heating element facing away from the interposer so as to counteract a condensation process.

BRIEF DESCRIPTION OF DRAWINGS

These and other features, aspects, and advantages of the apparatus, systems and methods of the present disclosure will become better understood from the following description, appended claims, and accompanying drawings, wherein:

DEFINITIONS

Figure 1:
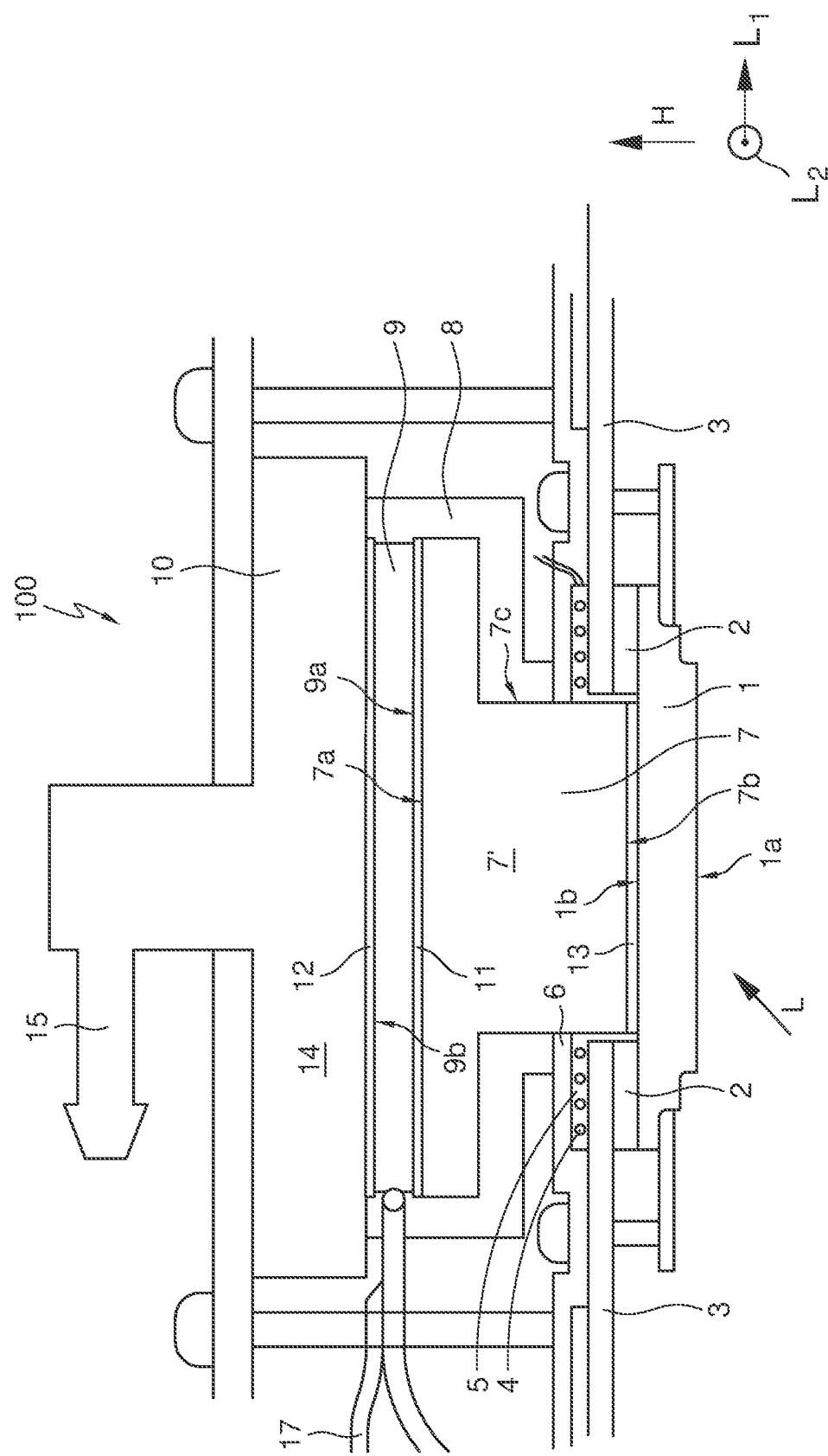
FIG. 1 shows a schematic cross-sectional side view of an electronic system according to the invention.

The following terms are provided solely to aid in the understanding of the invention. These definitions should not be construed to have a scope less than understood by a person of ordinary skill in the art.

DMD, also known as Digital Micro-mirror Device or Digital Mirror Device—An example of alight valve or a spatial light modulator.

Light Valve or spatial light modulator—In the text and claims the terms light valve and/or spatial light modulator are to be considered as synonymous. The spatial light modulator may be a reflective spatial light modulator. The term "reflective spatial light modulator" is to be understood as a spatial light modulator which modulates the light in reflective mode, e.g. using an addressable mirror, a series of mirrors as is found in the form of a rotating polygon or an array of individually addressable mirrors, more particularly, mirroring elements being part of the light modulator mounted in the package of the housing.

A reflective spatial light modulating device may comprise of different types of reflective light modulators, such as digital mirror device (DMD), a liquid crystal display (LCD) or a liquid crystal on silicon (LCOS). Preferably, the light modulators may be addressed on a pixel-by-pixel basis to thereby represent an arbitrary image of varying greyscale, e.g. video images. The DMD, also called digital mirror device or digital micro-mirror device, is a reflective spatial light modulator, comprising a semiconductor-based array of fast, reflective digital light switches that precisely control reflection of a light source using, for example, a binary pulse width modulation technique. A DMD has a matrix of a plurality of individually addressable and electrically deformable or moveable mirror cells. In a first state or position, each mirror cell of the digital mirror device acts as a plane mirror to reflect the light received to one direction, through a projection lens towards e.g. a projection screen, while in a second state or position they project the light received to another direction, away from the projection screen. In a reflective liquid crystal display (also known as LCOS) light valve, the light is not modulated by a mechanical displacement of a mirror, but by changing the polarization state of the liquid crystals in the light valve.

Peltier (element), also known as Peltier-Seebeck element—A thermo-electric device that may transfer heat from one point to another in function of the direction of the current circulating through it.

Interposer—Component that provides electrical connection to a reflective spatial light modulator such as a DMD. For example a reflective spatial light modulator such as a DMD may utilize a land grid array for the system electrical connections (similar to a socket or connector). Connections on the reflective spatial light modulator, such as the DMD, connect to contacts on the interposer which may be arranged to connect via traces or electrical connections through the interposer to contact traces or electrical connections on a PCB.

The interposer may have the electrical connections outside the active area of a reflective spatial light modulator such as the DMD, i.e. to the side or sides of this active area, while also making contact with a PCB formatter.

DESCRIPTION OF EMBODIMENTS

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it may directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The terms "about" or "approximate" and the like are synonymous and are used to indicate that the value modified by the term has an understood range associated with it, where the range may be +20%, +15%, +10%, +5%, or +1%. The term "substantially" is used to indicate that a result (e.g., measurement value) is close to a targeted value, where close may mean, for example, the result is within 80% of the value, within 90% of the value, within 95% of the value, or within 99% of the value.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIG. 1 shows a schematic cross-sectional side view of an electronic system 100 according to an aspect of the invention. The system 100 includes a heat dissipating electronic device 1 implemented as a Digital Micromirror Device DMD operative to convert an incident light beam L into a still or video image that may be projected, e.g. on a screen. The DMD 1 is provided, on a front side 1a thereof, with an array of micromirror elements that are individually movable controlled by digital information that has been processed so as to generate an image pattern. The DMD 1 also has a backside 1b dissipating heat.

The electronic system 100 also includes a cooling sub-assembly according to an aspect of the invention.

Furthermore, the electronic system 100 includes a printed circuit board 3, also referred to as PCB, on which printed circuit board the DMD 1 has been mounted. In the shown embodiment, the electronic system 100 further includes an interposer 2 providing electrical contact between the PCB 3 and the DMD 1. Typically, the printed circuit board 3 further includes electronics for receiving, processing, manipulating and feeding digital data to the DMD 1, via the interposer 2.

The cooling sub-assembly is arranged for cooling the DMD. The sub-assembly includes a vapor chamber 7, a peltier element 9 and a coldplate 10 placed on top of each other forming a stack such that the peltier element 9 is sandwiched between the vapor chamber 7 and the coldplate 10.

The vapor chamber 7 has a specific three-dimensional structure, composed of multiple box-shaped shapes. The vapor chamber 7 includes a top 7a, also called head, and a bottom 7b, also called foot, and a wall 7c extending between the head 7a and the foot 7b. Then, the chamber 7 includes a chamber volume or interior 7' that is mainly closed by the head 7a, the foot 7b and the wall 7c. The chamber head 7a is facing the peltier element 9, while the chamber foot 7b is facing the DMD 1, more specifically, the backside 1b of the DMD 1 for cooling purposes.

Generally, near the chamber head 7a, the vapor chamber 7 has larger dimensions in directions parallel to the chamber head 7a and the chamber foot 7b, than near the chamber foot 7b. The area of the chamber head 7a is larger than the area of the chamber foot 7b. As shown in FIG. 1, the wall 7c expands in lateral directions L1, L2, perpendicular to a height direction H pointing from the DMD 1 upwardly towards the cooling sub-assembly, along the stack orientation of the cooling sub-assembly.

The surface area of the head 7a may be a factor larger than the surface area of the foot 7b, wherein the factor is larger than 1. Preferably, said factor ranges between circa 1 and circa 10, more preferably between circa 1.5 and circa 5. As an example, the factor is circa 2, circa 2.5 or circa 3. However, other area ratio values may also be applied.

More detailed aspects of the three-dimensional vapor chamber structure are described below referring to FIGS. 5 and 6.

The cooling sub-assembly includes thermal interface material 11 between the peltier element 9 and the head 7a of the vapor chamber 7. Similarly, the cooling sub-assembly includes thermal interface material or solder 12 between the peltier element 9 and the coldplate 10 or the peltier element 9 is soldered to the coldplate 10. Also, thermal interface material 13 is applied in between the foot 7b of the vapor chamber 7 on the one hand and the backside 1b of the DMD 1 on the other hand, e.g. a small solid metal interface stud, e.g. including copper or aluminum. In other embodiments, an interface between stack modules and/or electronic device may be formed with other material or layer(s). The vapor chamber structure brings the water/fluid down close to the DMD 1.

In the shown embodiment, the peltier element 9, also referred to as Thermo electric cooler or TEC, has a cold side 9a and a hot side 9b. The cold side is facing towards the head 7a of the vapor chamber, and the hot side 9b of the peltier element is facing towards the coldplate 10. The hot side 9b of the peltier element may be soldered to the coldplate 10.

The peltier element 9 may be oversized so as to be capable of removing high thermal loads. The function of the peltier element 9 is to increase the thermal budget of the entire system, i.e. by creating a sub-ambient cold side and delivering the power at higher temperature to the coldplate 10 via its hot side 9b.

The coldplate 10 includes a liquid chamber 14, a liquid input port 15 and a liquid output port (not shown) serving as a liquid coldplate evacuating the high temperature heat efficiently to cooling liquid which is at or above ambient temperature.

In the shown embodiment, a cooling unit is provided including the peltier element 9 and the coldplate 10, the peltier element 9 being sandwiched between the vapor chamber 7 and the coldplate 10. Here, the coldplate is implemented as a liquid-cooled coldplate. However, the coldplate may be implemented in another way, e.g. as an air-cooled heatsink. Furthermore, the cooling unit may be provided without a peltier element 9 or without a coldplate 10. Then, the head 7a of the vapor chamber 7 faces the coldplate 10 or the peltier element 9, respectively.

Figure 2:
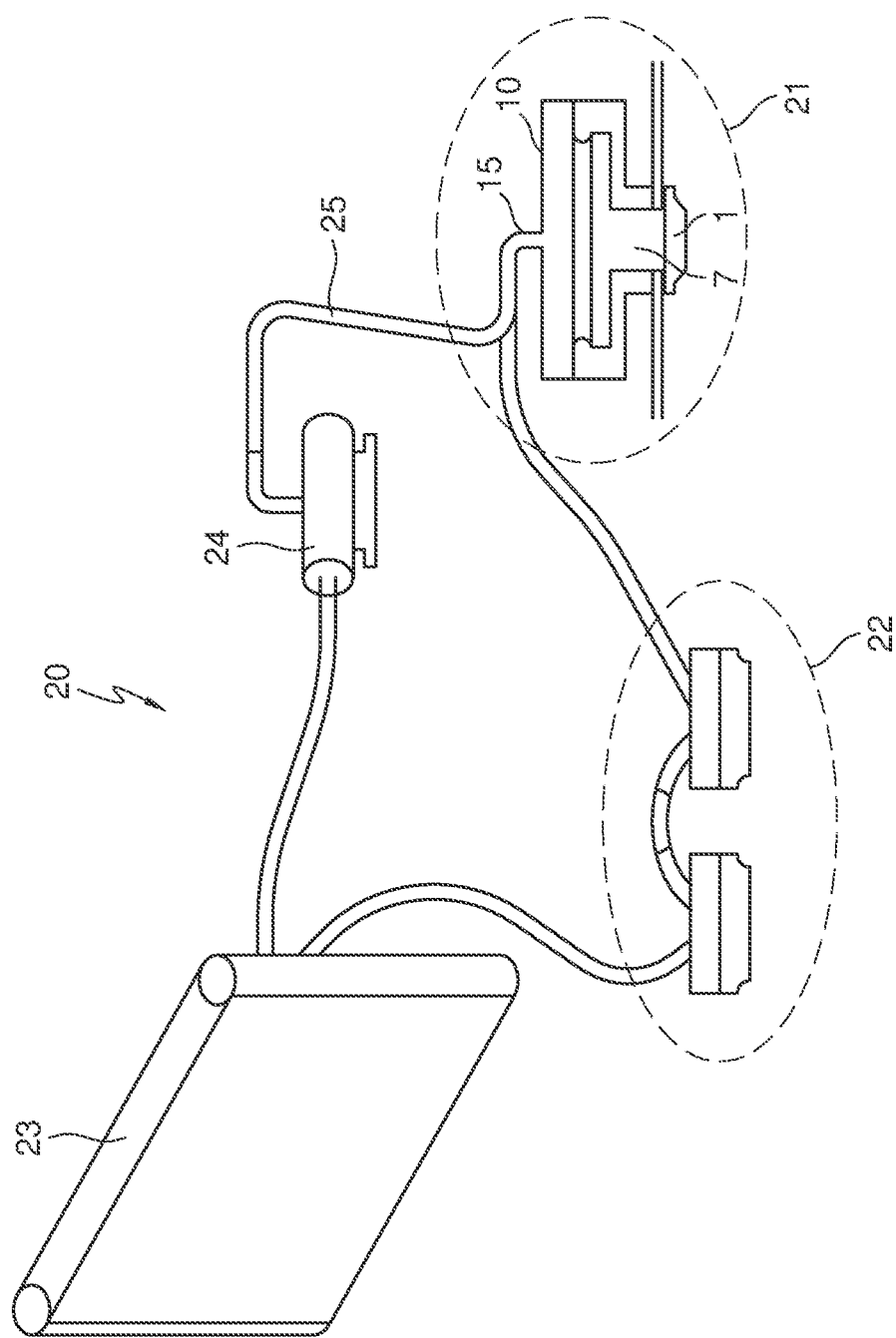
FIG. 2 shows a schematic system view of a possible cooling assembly according to the invention.

FIG. 2 shows a schematic system view of a possible cooling assembly 20 according to the invention. The cooling assembly 20 includes an electronic system 100 as described above, as well as two further coldplates 22. Also, the cooling assembly 20 includes a liquid to air radiator cooler 23 connected to the electronic system 100 and the two further coldplates 22 via a tubing 25 that are connected to the corresponding liquid input and output ports 15. The cooling assembly 20 further includes a pump 24 inducing a liquid flow in the tubing 25 so as to transfer the heat from the peltier hot side 9b towards the environment. It is noted that instead of or in addition to the liquid to air radiator 23, a liquid to liquid heat exchanger may be applied.

Turning back to the electronic system 100 shown in FIG. 1, it is noted that the backside 1b of the DMD contacts the external surface of the vapor chamber foot 7b. In the shown embodiment, the foot 7b of the vapor chamber 7 traverses a hole in the PCB 3 allowing the DMD 1 to be located on one side, the lower side, of the PCB 3, while the cooling sub-assembly is located mainly on the other side, the upper side, of the PCB 3.

As shown in FIG. 1, a heating element 4, e.g. a flexible foil heater, may be mounted on the PCB 3 above the interposer 2 to locally heat this area to above a dew point to counteract that condensation forming occurs on the interposer 2. In order to avoid a thermal short circuit between the heating element 4 and cold components, a heat insulating layer 5 is applied on top of the heating element 4, on a side facing away from the interposer 2. The heating insulating layer 5 serves as a local seal 5 between the DMD 1, Interposer 2 and PCB 3 on the one hand and the vapor chamber 7 on the other hand to also prevent condensation forming in proximity of the DMD backside 1b. The local seal 5 may contain a rubber material. Although the local seal 5 may not be completely airtight it serves to reduce the air volume such that the trapped water volume is low enough not to cause parasitic resistance or even short circuits.

The electronic system 100 shown in FIG. 1 further includes a backer plate 6 clamping the DMD 1— interposer 2—heating element 4 stack together, and on the PCB 3. The backer plate 6 also serves as an interface for clamping the coldplate 10 to the DMD 1. It is noted, however, that other mounting techniques may be applied to fix the DMD 1, the interposer 2, the hating element 4 and the cooling sub-assembly together.

The electronic system 100 further includes insulation material 8 surrounding the side wall 7c of the vapor chamber 7 and/or the peltier element 9. The insulation material 8 may include closed-cell foam or other insulation material serving to create a sufficient temperature gradient between the cold inner surfaces and warmer exterior moisture containing air to prevent condensation. A conductive high temperature gradient may be achieved on the inside while a convective low temperature gradient may be reached on the outside. This may be done by increasing the heat transfer between the air and the foam, causing a hot outer layer which is at a temperature higher than the dew point.

Generally, parts of the cooling sub-assembly having a lower temperature than ambient air during operation, i.e. the cold parts, may be surrounded by insulation material to realize a good seal against moisture ingression.

Figure 3:
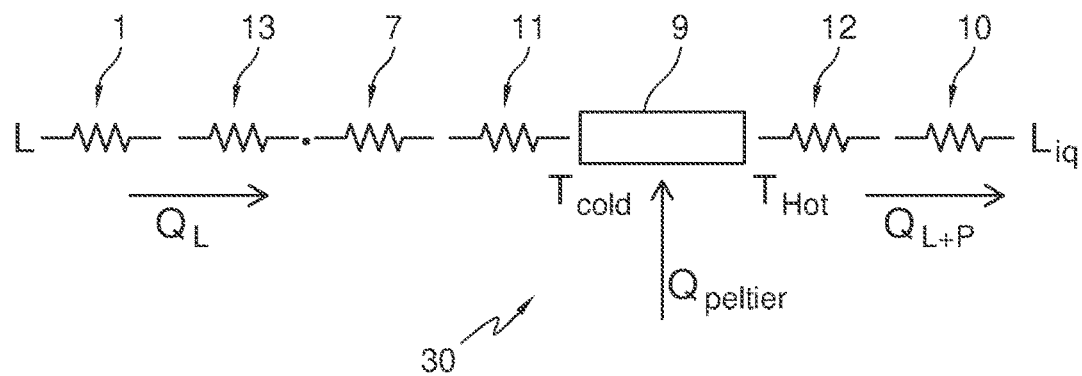
FIG. 3 shows a heat flow representation of the electronic system shown in FIG. 1.

FIG. 3 shows a heat flow representation of the electronic system 100 shown in FIG. 1. The heat flow representation includes a chain of serial resistors each representing components in the electronic system 100. The chain includes, from the left to the right, the DMD 1, that is exposed to an incident light beam L, a thermal interface material 13, the vapor chamber 7, a thermal interface material 11, the peltier element 9, a thermal interface material or solder 12 and the coldplate 10 outputting the heat via the liquid Liq. The peltier element 9 has a cold side having temperature Tcold and a hot side having temperature Thot. The thermal load of the incident light beam L is QL, while the thermal load of electrical energy towards the peltier element 9 is Q peltier. Thus, the overall thermal load to the output liquid Liq is QL+Q peltier.

It is noted that the vapor chamber 7 has a very low thermal resistance, even compared to copper. The advantages being, that for the same thermal target and power of the DMD 1, the liquid temperature need not be as low as in traditional solutions when cooling the vapor chamber 7. This may result in a more compact or quieter liquid cooler 23 shown in FIG. 2. Moreover, because the vapor chamber 7 is hollow inside, this offers a weight advantage, the light mass of the chamber 7 being critical to the optical performance of the DMD 1.

The thermal resistance of the electronic system 100 may remain very low such that the heat is transferred efficiently, i.e. both in the height direction H perpendicular to the DMD backside 1b as well is in planar or lateral directions (heat spreading).

By using the vapor chamber-like structure, a large peltier element 9 may be used. Also a large coldplate 10 may be used. In this way, the peltier element 9 may work at an efficient working point or may have an increased thermal capacity. The coldplate 10 may have a low thermal resistance to handle both the light dissipation power and the peltier dissipation power.

Figure 4:
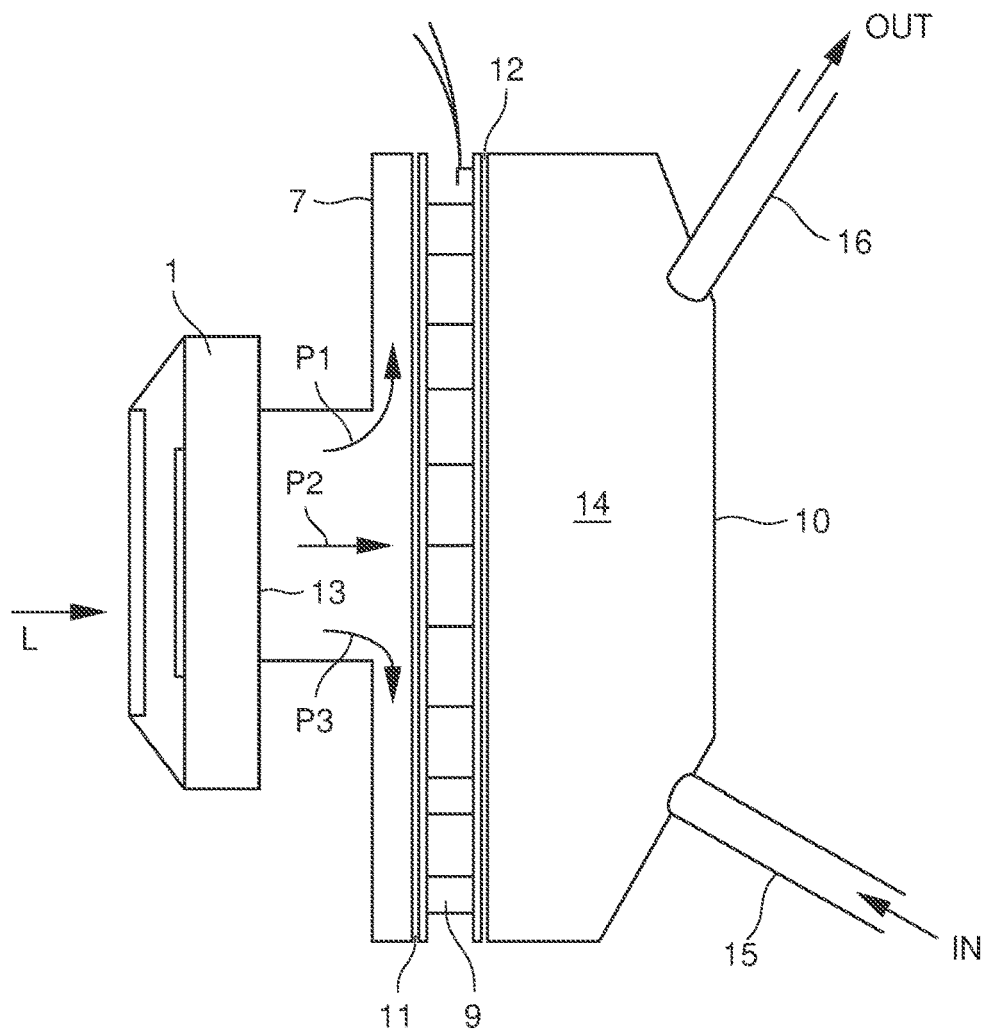
FIG. 4 shows a schematic cross-sectional side of a cooling sub-assembly according to the invention mounted on a heat dissipating electronic device.

FIG. 4 shows a schematic cross-sectional side of a cooling sub-assembly according to the invention mounted on a heat dissipating electronic device 1 implemented as a DMD. The overall structure is similar to the cooling sub-assembly and the DMD shown in FIG. 1. The view in FIG. 4 is tilted over 90 degrees relative to the view in FIG. 1, and also shows heat paths P1, P2, P3 inside the vapor chamber 7. Furthermore, a liquid output port 16 is shown, in combination with a liquid input port 15, both being in communication with the liquid chamber 14 of the coldplate.

Figure 5:
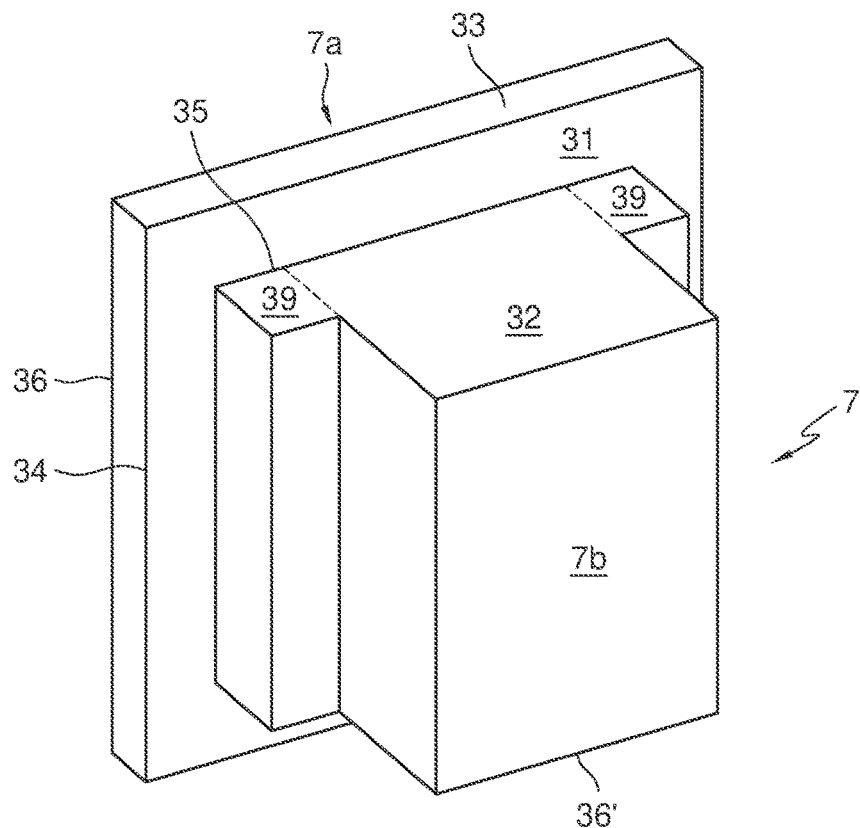
FIG. 5 shows a schematic perspective view of the foot of a first embodiment of a vapor chamber of a cooling sub-assembly according to the invention.

FIG. 5 shows a schematic perspective foot view of a first embodiment of a vapor chamber 7 of a cooling sub-assembly according to the invention. Similar to the structure of the vapor chamber 7 shown in FIG. 1, the chamber 7 expands going upward to the head. The vapor chamber 7 has a top or head 7a and bottom or foot 7b limiting the interior volume of the chamber at its top and its bottom, respectively. Both the head 7a and the foot 7b have a closed edge contour, referred to as the head edge contour 36 and the foot edge contour 36', respectively. The wall extends from the head edge contour 36 to the foot edge contour 36'. The head 7a and the foot 7b are mainly flat and mainly parallel to each other.

In the shown embodiment, the wall includes a first wall portion 33, an intermediate flange portion 31 and a second wall portion 32. Here, the intermediate flange portion 31 extends in a mainly flat plane between a flange outer contour 34 and a flange inner contour 35, and is substantially parallel with the orientation of the head 7a and the foot 7b.

Furthermore, in the shown embodiment, the first wall portion 33 extends between the head edge contour 36 and flange outer contour 34, while the second wall portion 32 extends between the flange inner contour 35 and the foot edge contour 36'. From the head 7a to the bottom 7b, the first wall portion 33, the intermediate flange portion 31 and the second wall portion 32 form a closed wall. Also, in a circumferential direction around the chamber interior 7', the first wall portion 33, the intermediate flange portion 31 and the second wall portion 32 form a closed wall.

It is noted that the intermediate flange portion 31 may be closed, enclosing the foot 7b in the lateral directions L1, L2, or may be formed as a flange portion surrounding the foot 7b merely partially.

In the embodiment shown in FIG. 5, the side wall also includes stiffening pillars 39 for stabilizing the second wall portion 32.

Figure 6:
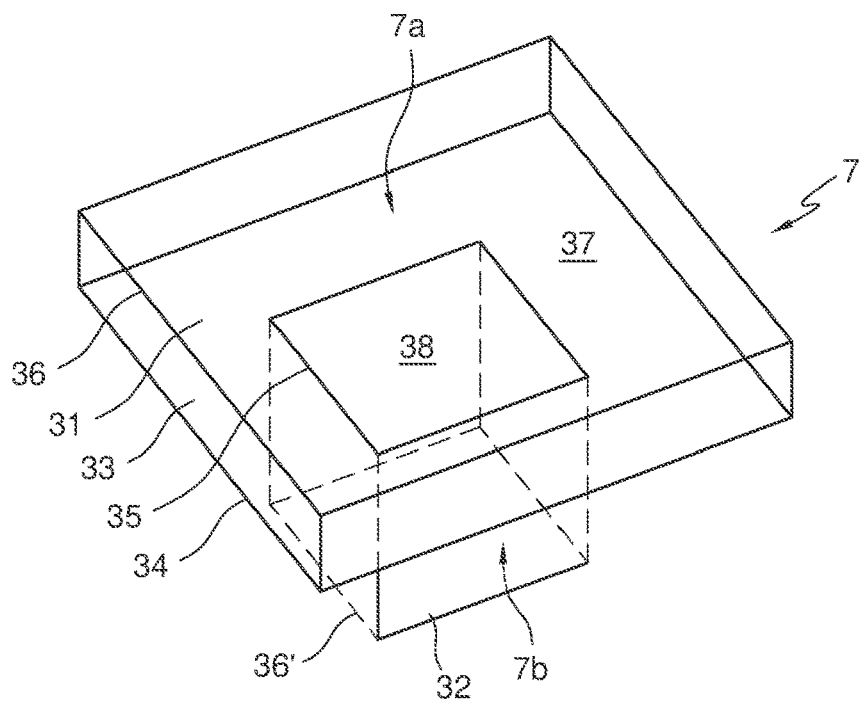
FIG. 6 shows a schematic perspective view of the head of a second embodiment of a vapor chamber of a cooling sub-assembly according to the invention.

FIG. 6 shows a schematic perspective head view of a second embodiment of a vapor chamber 7 of a cooling sub-assembly according to the invention. The structure of the vapor chambers 7 shown in FIG. 6 and FIG. 7 is similar. In FIG. 6, the stiffening pillars 39 for stabilizing the second wall portion 32 have been removed. As is most apparent from FIG. 6, the interior of the vapor chamber 7 is a composition of two box-shaped volumes, viz. a first box-shaped volume 37 between height levels of the head 7a and the intermediate flange portion 31, and a second box-shaped volume 38 between height levels of the intermediate flange portion 31 and the foot 7b. The box-shaped volumes 37, 38 may be mutually aligned or may be located mutually eccentric.

In the shown embodiments, the side wall portions 32, 33 are mainly perpendicular to the orientation of the head 7a, the foot 7b and the intermediate flange portion 31. However, in other embodiments, the side wall portions may be tilted, e.g. tapering towards the head 7a. Further, the wall portions 32, 33 may be flat or curved.

Also, further intermediate flange portions may be applied so as to form a vapor chamber interior 7' that is a composition of three or more box-shaped volumes stacked on top of each other with increasing top area to enable the heat paths in the chamber to expand. However, the wall may also be implemented without an intermediate flange portion, e.g. applying a tapering wall portion.

In the above embodiments, the edge contours as well as the flange contours are similar having the same shape, e.g. a rectangular shape. In yet further embodiments, said countours may have other similar shapes, e.g. another polygone profile, or a curved closed contour such as a circle.

Further, the head 7a, the foot 7b and the intermediate flange portion(s) may be non-parallel and even non-flat or non-planar.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures may not also be used to advantage. The present embodiments may thus include all working combinations of the claims wherein each claim may in principle refer to any preceding claim unless clearly excluded by context.

While the invention has been described hereinabove with reference to specific embodiments, this was done to clarify and not to limit the invention.

As an example, it is noted that the heat dissipating electronic device show in FIG. 1 may be mounted on a PCB or another carrier such as a flexfoil or other substrate.

It is further noted that the heat dissipating electronic device may be a spatial light modulator such as a DMD or projector chip or another device such as a laser device, e.g. a laser emitting red light, the laser device being cooled so as to lower its wavelength by sub-ambient cooling which reduces the incident optical power exposed to the DMD. Further, the heat dissipating electronic device may be a general computer chip.

The skilled person will appreciate that various modifications and different combinations of disclosed features are possible without departing from the scope of the invention.

The invention claimed is:

1. A cooling sub-assembly for cooling a heat dissipating electronic device disposed on a printed circuit board, comprising:
    a heat spreader and a cooling unit placed on top of each other forming a stack,
    wherein the heat spreader has a head facing the cooling unit, a foot for facing the heat dissipating electronic device, and a wall extending between the foot and the head, wherein the head of the heat spreader forms a first box-shaped volume and the foot of the heat spreader forms a second box-shaped volume that limit an interior volume for the heat spreader at a top of the heat spreader and at a bottom of the heat spreader, and wherein the first box-shaped volume and the second box-shaped volume form a single interior volume, and wherein the area of the head is larger than the area of the foot, and
    an insulation material surrounding at least the wall of the heat spreader;
    a heating element disposed above an interposer and configured to heat the interposer providing electrical connection between the printed circuit board and the heat dissipating electronic device, wherein the heating element and the heat spreader are stacked on a same side of the heat dissipation electronic device.

2. The cooling sub-assembly according to claim 1, wherein the cooling unit includes a coldplate.

3. The cooling sub-assembly according to claim 2, wherein the cooling unit further includes a thermo electric element sandwiched between the heat spreader and the coldplate, and the insulation material further surrounding the thermo electric element.

4. The cooling sub-assembly according to claim 1, wherein the head has a closed edge contour and the foot has a closed edge contour, and wherein the wall extends between the closed edge contour of the head and the closed edge contour of the foot.

5. The cooling sub-assembly according to claim 4, wherein the wall includes a first wall portion, a second wall portion and an intermediate flange portion, the flange portion extending between a flange outer contour and a flange inner contour, such that the first wall portion extends between the closed edge contour of the head and flange outer contour and that the second wall portion extends between the flange inner contour and the closed edge contour of the foot.

6. The cooling sub-assembly according to claim 1, wherein the head is mainly parallel to the foot and/or wherein the intermediate flange portion is mainly parallel to the head and/or the foot.

7. The cooling sub-assembly according to claim 1, wherein the area of the head is a factor larger than the area of the foot, wherein the factor is larger than 1.

8. The cooling sub-assembly according to claim 1, wherein a cold side of the thermo electric element is facing towards the head of the heat spreader, and wherein a hot side of the thermo electric element is facing towards the coldplate.

9. The cooling sub-assembly according to claim 1 wherein the hot side of the thermo electric element is soldered to the coldplate.

10. The cooling sub-assembly according to claim 1, wherein the stack includes thermal interface material between the thermo electric element and the head of the heat spreader and/or between the thermo electric element and the coldplate and/or between the foot of the heat spreader and the heat dissipating electronic device.

11. The cooling sub-assembly according to claim 1, wherein the coldplate is implemented as a liquid-cooled coldplate including a liquid chamber, a liquid input port and a liquid output port.

12. The cooling sub-assembly according to claim 1, wherein the coldplate is implemented as an air-cooled heatsink.

13. The cooling sub-assembly according to claim 1, wherein parts that operatively have a lower temperature than ambient air, are surrounded by the insulation material.

* * * * *